(12) United States Patent
Haas et al.

(10) Patent No.: US 10,345,347 B2
(45) Date of Patent: Jul. 9, 2019

(54) DEVICE AND METHOD FOR FAULT CURRENT DETECTION

(71) Applicant: ebm-papst Mulfingen GmbH & Co. KG, Mulfingen (DE)

(72) Inventors: Guenther Haas, Mulfingen (DE); Helmut Lipp, Doerzbach-Hohebach (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 261 days.

(21) Appl. No.: 14/831,015

(22) Filed: Aug. 20, 2015

(65) Prior Publication Data

US 2016/0245847 A1 Aug. 25, 2016

(30) Foreign Application Priority Data

Feb. 20, 2015 (DE) .......................... 10 2015 102 485

(51) Int. Cl.

| *G01R 19/165* | (2006.01) |
|---|---|
| *G01R 19/10* | (2006.01) |
| *H02H 3/16* | (2006.01) |
| *H02H 3/33* | (2006.01) |
| *H02H 5/12* | (2006.01) |
| *H02H 7/12* | (2006.01) |
| *G01R 31/12* | (2006.01) |

(Continued)

(52) U.S. Cl.
CPC ....... *G01R 19/16538* (2013.01); *G01R 19/10* (2013.01); *G01R 31/1227* (2013.01); *G01R 31/28* (2013.01); *H02H 3/087* (2013.01); *H02H 3/16* (2013.01); *H02H 3/332* (2013.01); *H02H 3/334* (2013.01); *H02H 5/12* (2013.01); *H02H 7/1216* (2013.01)

(58) Field of Classification Search
CPC .............. G01R 19/10; G01R 19/16538; G01R 31/1227; G01R 31/28; G01R 15/18; G01R 15/181; G01R 15/183; G01R 31/024; G01R 31/025; G01R 31/026; H02H 3/087; H02H 3/16; H02H 3/332; H02H 3/334; H02H 5/12; H02H 7/1216; H02M 5/40; H02M 5/42; H02M 5/458; H02M 5/4585; H02M 5/46; H02M 5/48; H02P 23/26
USPC ....... 320/109, 126, 127, 128, 509, 538, 551, 320/161, 162; 324/127, 509, 551, 109, 324/161, 162, 126, 128, 538, 765.01; 361/45; 318/400.3, 438, 729; 323/301, 323/303; 363/37, 89
See application file for complete search history.

(56) References Cited

U.S. PATENT DOCUMENTS 6,072,291 A * 6/2000 Pedersen ................. B60L 7/003
    318/362
6,906,933 B2 * 6/2005 Taimela .................... H02J 3/32
    363/34

(Continued)

FOREIGN PATENT DOCUMENTS

| DE | 19634438 A1 | 3/1998 | |
|---|---|---|---|
| DE | 102007027727 A1 | 1/2008 | |
| WO | WO-2015101870 A1 * | 7/2015 | ............. D06F 37/42 |

*Primary Examiner* — Jeff W Natalini
*Assistant Examiner* — Steven L Yeninas
(74) *Attorney, Agent, or Firm* — Harness, Dickey & Pierce, P.L.C.

(57) ABSTRACT

The invention relates to a method and a device for detecting fault currents in a regulated DC intermediate circuit having an active power factor correction.

8 Claims, 5 Drawing Sheets

(51) Int. Cl.
*G01R 31/28* (2006.01)
*H02H 3/087* (2006.01)

(56) References Cited

U.S. PATENT DOCUMENTS

| | | | | |
|---|---|---|---|---|
| 2005/0212505 A1* | 9/2005 | Murray | ............... | G01R 15/146 |
| | | | | 324/126 |
| 2013/0128396 A1* | 5/2013 | Danesh | ................. | G01R 19/00 |
| | | | | 361/45 |
| 2014/0021921 A1* | 1/2014 | Thommes | ............ | B60L 3/0069 |
| | | | | 320/109 |
| 2014/0091763 A1* | 4/2014 | Thommes | ............. | H02H 3/167 |
| | | | | 320/109 |
| 2015/0070047 A1* | 3/2015 | Yan | ..................... | G01R 31/024 |
| | | | | 324/765.01 |
| 2015/0128662 A1* | 5/2015 | Kim | ..................... | D06F 37/304 |
| | | | | 68/3 R |
| 2015/0309104 A1* | 10/2015 | Moll | ................... | H02H 1/0015 |
| | | | | 324/537 |
| 2015/0355262 A1* | 12/2015 | Hu | .......................... | H02H 3/16 |
| | | | | 324/509 |
| 2017/0259669 A1* | 9/2017 | Eckert | .................. | B60L 3/0069 |

* cited by examiner

DEVICE AND METHOD FOR FAULT CURRENT DETECTION

The present invention relates to a fault current detection monitoring for electronically commutated DC machines, and to a method for detecting a fault current.

In electrical systems and in the case of EC DC machines, it is necessary to be able to reliably detect a fault current. The spectral and in-phase detection of absolute currents and relative currents is essential for assessing the risk of fault currents and for evaluating the risk potential of fault currents for human beings and for materials.

A fault current refers to an electric current that flows across a given fault location due to an insulation defect. To calculate the fault current strength, it is necessary, depending on the type of fault and fault location, to take into consideration the transformer resistances, the conductor resistance, ground resistances, resistances of the body, the resistance of the human being coming into contact with the fault location and, if applicable, additional transition resistances. In electrical installation technology, the risk potential through an electrical system is assessed on the basis of instantaneous values of the currents to be monitored in the AC mains network. This applies to both absolute values and to relative values and/or difference values of the currents to be monitored, these current values also being referred to as fault current. This type of risk detection is employed in the form of fault current circuit breakers, also referred to as Fl switches, and which measure the differential current between a feed conductor and a return conductor.

If such a fault current circuit breaker (in short: FC circuit breaker) is installed in the relevant electric circuit and the requisite rated differential current is attained, the circuit breaker switches the electric circuit off at all poles.

A wide variety of methods for evaluating the risk potential from fault currents for human beings and material are described in the prior art. The patent specification DE 196 34 438 A1, for example, describes a fault current protection device or differential current protection device for protecting against dangerous shock currents. The protection device for protecting against fault currents is intended to be tuned with variable frequency in its trip characteristic to trip-values with respect to a frequency factor F as a quotient derived from the permissible shock current for a human being at the variable frequency of the fault current and a permissible shock current at 50 Hz or 60 Hz, and with respect to the frequency (f) of the fault current below a threshold curve according to a given diagram.

A device for detecting fault currents in electrical circuits in machines is known from DE 102007027727 A1, in which at least one electrical circuit in the machine includes an electromagnetic filter, and wherein the electromagnetic filter is connected to a measuring device for detecting a fault current.

When using electronically commutated DC machines, the question arises as to the use of the appropriate Fl circuit breaker. The selection of the Fl circuit breaker depends essentially on the current form of a potentially occurring fault current. There are different types of fault current circuit breakers, which are associated with a particular type depending on the type of fault current they are able to detect.

Type-AC fault current circuit breakers only detect purely sinusoidal fault currents and are no longer permitted as a fault current protection device in Germany according to the currently applicable VDE 0100-530.

Type-A fault current circuit breakers comprise commercially available fault current protection devices sensitive to pulsating currents. This type can detect both purely sinusoidal AC currents as well as pulsating DC fault currents. The required sensitivity is achieved by means of special magnetic materials for the toroidal core and resonance circuits used for influencing the frequency response. Fault current protection devices sensitive to pulsating currents operate independently of the mains voltage.

Type-F fault current circuit breakers are fault current protection devices sensitive to mixed frequencies and, accordingly, also detect all fault current types as in the case of Type-A. They are also useful for detecting fault currents consisting of a frequency mixture of frequencies. Thus, it is possible to detect the fault current forms on the output side of single-phase connected frequency converters.

Type-B fault current circuit breakers are fault current circuit breakers sensitive to all currents, and are able to detect smooth DC fault currents as well as AC fault currents. These fault current protection devices include a second summation current transformer and an integrated electronics unit. Monitoring of DC fault currents using a type-B fault current protection device, however, requires an independent current supply. Thus, the operation and use is independent of the mains voltage. The AC and pulsating current sensitive switch component is independent thereof, and operates independently of the mains voltage, as in the case of type-A.

The use of type-B is commonplace, in particular in conjunction with inverters and frequency converters, which operate in the area of the intermediate circuit with rectifiers.

An essential element of a fault current circuit breaker in this case is the so-called summation current transformer, through which all live conductors, including the neutral conductor, are guided together in the same direction. Normal and appropriate operating currents have no effect on this summation current transformer, since the sum does not result in a differential current.

However, as soon as a fault current flows from the closed circuit to ground potential, the electromagnetic balance of the transformer is disrupted by the magnitude of the fault current flowing to ground. As a consequence, the transformer is magnetized and momentarily causes the universal deactivation of the fault current circuit breaker via a highly sensitive trip.

Thus, type A fault current circuit breakers measure the AC current portion of the fault current, wherein the DC current portion of the fault current is not detected and, therefore, also cannot be evaluated.

Currently, only type B Fl circuit breakers are known in connection with the use of electronically commutated devices. In addition to devices with passive PFC stage, it is only recently that devices with active PFC stage have become common on the market. Type-A Fl circuit breakers are primarily integrated in building installations. The fact that in this case these Fl circuit breakers may not detect fault currents in devices having active PFC regulation, and thus are probably not tripped, is not disadvantageous or dangerous.

However, the methods known in the prior art cannot be used with electronically commutated DC machines having an active PFC regulation and boosted intermediate circuit voltage while complying with the installation technology-related standards and regulations. In such devices, it is not possible to employ a type A fault correction circuit breaker (Fl-circuit breaker). In the event of a fault (for example, in the case of defective insulation) a DC current flows as a result of the boosted voltage, which flow a type-A Fl circuit breaker (as explained above) is unable to switch off.

In as much, it is disadvantageous that instead of the conventional and significantly more favorable type-A Fl circuit breaker, it is possible to employ only the many times more expensive type-B Fl circuit breaker.

The object of the present invention is to overcome the aforementioned disadvantage and to provide a solution for intermediate circuits having active PFC regulation and boosted voltage, the fault currents of which may nevertheless be reliably and safely operated using a type-A Fl circuit breaker.

A further object of the present invention is to provide a solution which ensures a reliable maximum switch-off time for tripping the Fl switch in accordance with the relevant VDE installation standards and erection specifications.

The basic concept of the present invention here is to generate a switch-off condition for the active power factor correction from the current signals in the feed and return conductor (i.e., the live conductors) to the commutation circuit when the magnitude of a difference signal proportional to the current signal indicates that a fault current above a maximum permissible limit exists in the system. This results in a change in the wave form of the fault current and in a form which is detected by a type-A Fl switch.

Thus, according to the invention, a device is provided for detecting fault currents in a regulated DC intermediate circuit having an active power factor correction (PFC), which includes the following:

- a detection device for detecting currents S1, S2 (current signals), which flow through the two live conductors (feed and return conductor) on the input side,
- a transformer for generating in each case an analog signal S1', S2' from the respectively detected signals S1, S2,
- a differential amplifier for amplifying and/or preparing a signal $S_{DIFF}$ as the difference signal from the signals S1', S2', wherein the difference signal corresponding to a detected fault current exceeds a maximum permissible threshold value of the signal $S_{DIFF}$ (switches PFC, thereby reducing $U_{IC}$), and
- a circuit configuration for the (active) lowering of the intermediate circuit voltage, so that the signal $S_{DIFF}$ may be utilized by a type-A Fl circuit breaker for switching off.

Thus, a commutation circuit fed from a DC voltage intermediate circuit having an active power factor correction and, optionally, a boosted voltage may also be successfully operated in an inventive manner with a type-A Fl circuit breaker for detecting fault currents.

In a particularly preferred embodiment of the invention, it is provided that the lowering of the intermediate circuit voltage is brought about by switching off the active power factor correction. As a result, the intermediate circuit voltage between $U_{IC+}$ and the ground potential (or the protective ground) and the wave form of the fault current curve changes to a wave form detectable by a type-A Fl, which is the profile of a fault current curve corresponding to commutation electronics having passive power factor correction. This means, that due to the change of the voltage curve of the voltage, the profile of the fault current also changes accordingly, which is then detected by a type-A Fl circuit breaker and the fault current may be safely switched off.

It is preferably provided that the detection device includes an electrical component in each of the two live conductors for tapping signals, in particular, current signals ($I_{feed}$, $I_{return}$). A configuration in which the two electrical components (3a, 3b) constitute in pairs either resistances, inductances or magnetic field sensors, is particularly preferred.

In a further advantageous embodiment of the invention, it is provided that the differential amplifier comprises, for example, a signal preparation module, which is designed to prepare the difference signal $S_{DIFF}$ so that it may be further processed by a microcontroller, an ASIC, an integrated circuit or the like. In this respect, it is advantageous if the circuit configuration includes a microcontroller, an ASIC or an integrated circuit for processing the signal $S_{DIFF}$.

A further aspect of the present invention relates to a method for detecting fault currents according to a device as previously described, in which

- two signals S1, S2, each proportional to the currents that flow through the two live conductors (i.e., through the feed line and return line) on the input side during operation of the device, are detected by the detection device,
- a preferably analog signal S1', S2' is generated in each case from the detected signals S1, S1,
- a signal $S_{DIFF}$ is prepared as a difference signal from the signals S1' S2' corresponding to a detected fault current, and the intermediate circuit voltage is lowered so that the signal $S_{DIFF}$ may be utilized by a type-A Fl circuit breaker for switching off, if the fault current exceeds a maximum permissible threshold value.

An implementation of the method is particularly advantageous if, with the aid of the active lowering of the intermediate circuit voltage, the voltage curve between the intermediate circuit voltage and the ground potential is such that a switching off of the PFC occurs. This may advantageously occur, in that the intermediate circuit voltage is lowered by switching off the active power factor correction.

This occurs preferably only when, as indicated above, the fault current exceeds a defined threshold value. If, accordingly, the difference signal shows a magnitude above a threshold value, the active power factor correction is switched off or bridged.

Other advantageous refinements of the invention are characterized in the subclaims and are described in greater detail below together with the description of the preferred embodiment of the invention with reference to the figures, in which:

Figure 1:
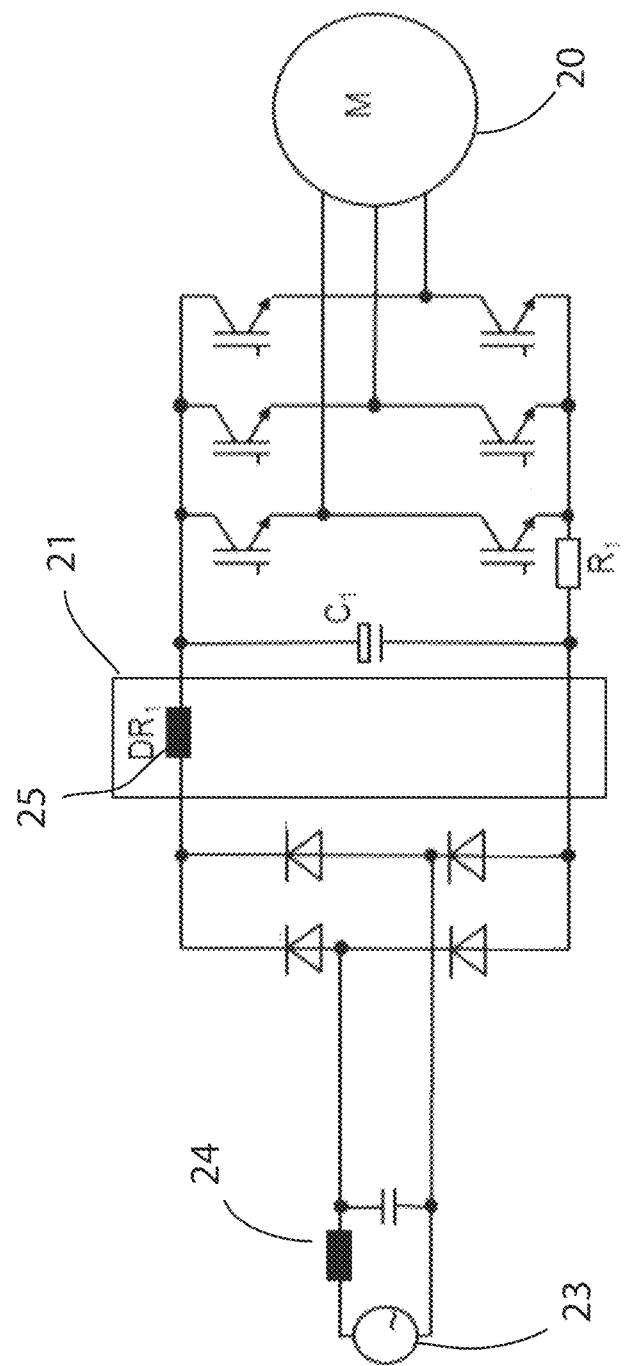
FIG. 1 shows a basic circuit diagram of known commutation electronics for a 3-chain EC motor having a passive PFC.

In the following description, based on FIGS. 1 through 7, identical reference numerals refer to identical structural or functional features. FIG. 1 shows the basic circuit diagram of commutation electronics having passive PFC 21 for a 3-chain EC motor 20, which is connected on the input side to an AC voltage source 23 via an EMV filter 24 consisting of an L-C combination. The passive power factor correction 21 in this case consists merely of an intermediate circuit choke 25.

Figure 2:
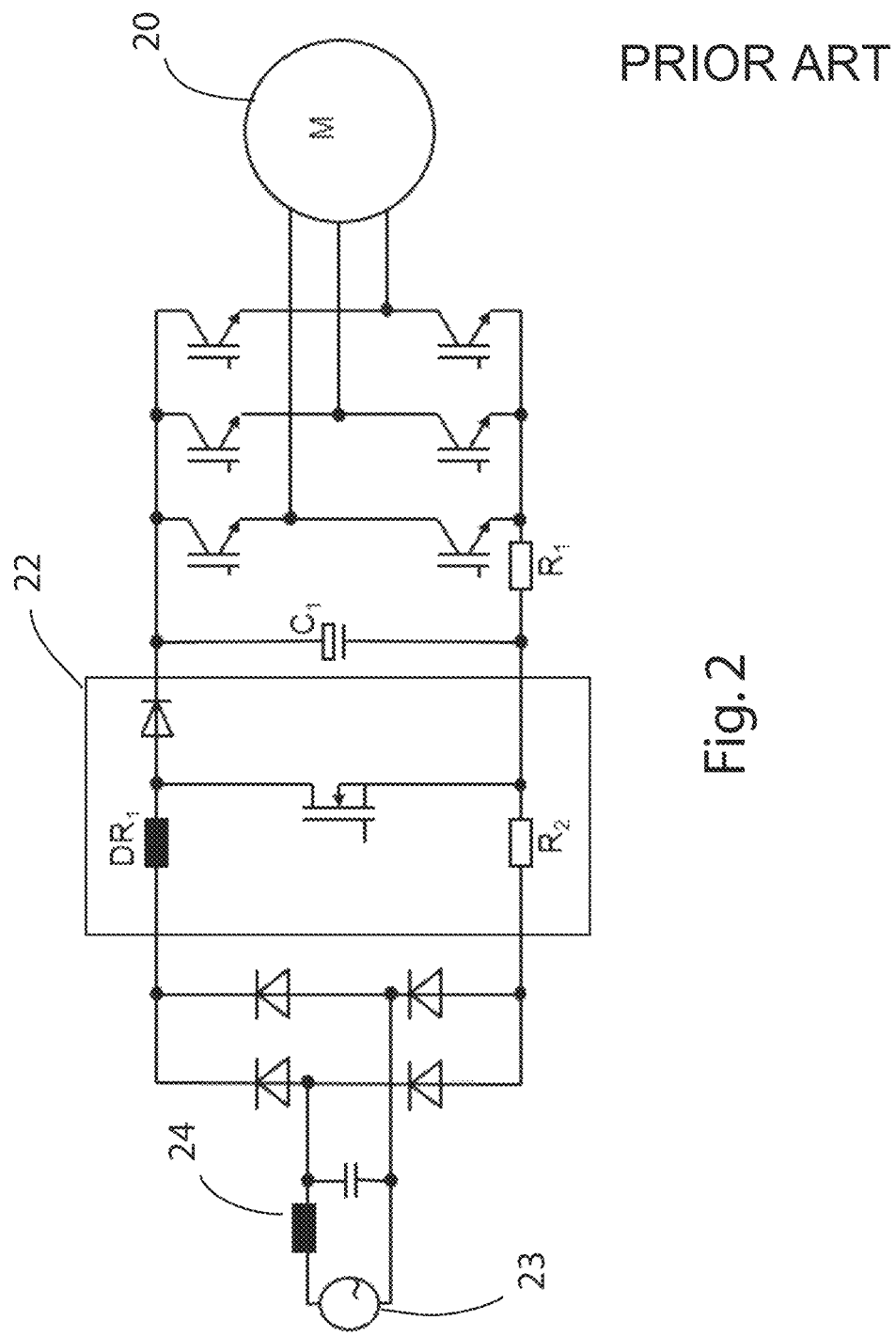
FIG. 2 shows a basic circuit diagram of a known commutation electronics for a 3-chain EC motor having an active PFC.

FIG. 2 depicts commutation electronics having an active power factor correction 22. In electronics having passive PFC according to FIG. 1, the intermediate circuit voltage present across the capacitor $C_1$ has a value of $U_{c1} = \sqrt{2} * U_{ac}$, wherein $U_{ac}$ is the feed AC voltage. In a commutation circuit having an active PFC, as depicted in FIG. 2, the voltage across the capacitor $C_1$ may be set to values of $U_{IC} > \sqrt{2} * U_{ac,rms}$. Typical values used in EC devices are at voltages in the range of 380 VDC to 440 VDC.

Accordingly, a voltage is present between the positive terminal of the capacitor (anode) and the PE potential (protective ground potential), the nature of which depends on the topology, as shown in the figures described below.

Figure 3:
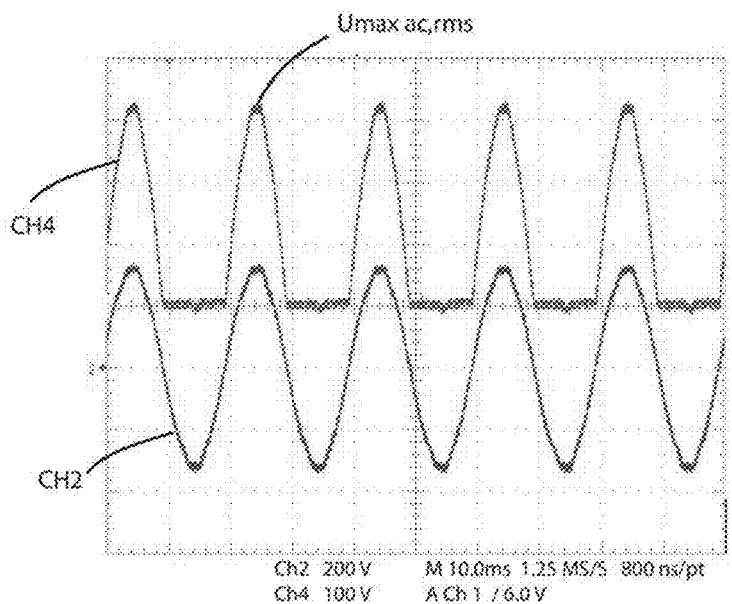
FIG. 3 shows in CH4 the voltage curve between the intermediate circuit voltage and the protective ground potential in an inverter having passive PFC, CH2 shows the mains input voltage.
Figure 4:
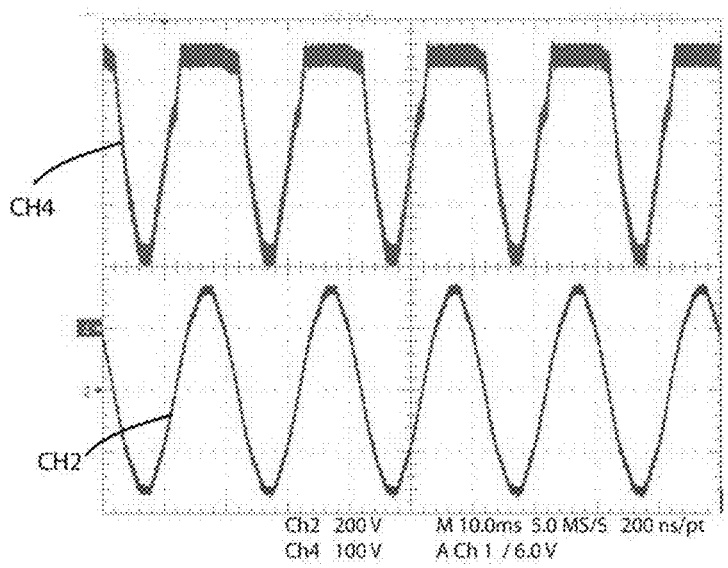
FIG. 4 shows in CH4 the voltage curve between the intermediate circuit voltage and the protective ground potential in an inverter having active PFC, CH2 shows the mains input voltage.

FIG. 3 shows the voltage curve between the intermediate circuit voltage and the protective ground potential in an inverter having passive PFC and FIG. 4 shows the voltage curve between the intermediate circuit voltage and the protective ground potential in an inverter having active PFC.

Measured curves are shown, which are associated with corresponding measured channels. The sinusoidal input voltage of the AC voltage source is depicted in the lower curve on the channel Ch2. The voltage curve between the intermediate circuit voltage and the protective ground potential is shown in channel Ch4 for an inverter having passive PFC. It is clearly apparent that the potential between the intermediate circuit voltage and the protective ground potential, i.e., the voltage $U_{IC}$ relative to the protective ground potential (PE potential) alternates between the values 0V and $U_{max,ac,rms}$.

As a comparison, FIG. 4 shows the voltage curve between the intermediate circuit voltage and the protective ground potential in an inverter having active PFC. In this case, the voltage potential between the anode of the capacitor and the protective ground potential is always greater than 0V. The minimum value is at $U_{min} = U_{IC-ac,rms}$.

If an insulation fault is present in the aforementioned examples, this then corresponds topologically to a state in which a resistance between the positive intermediate circuit potential and the protective ground (PE) potential is introduced. The fault current then also behaves in accordance with the voltage curve. In the inverter according to FIG. 1, the current will periodically recede to 0 A and in the inverter according to FIG. 2 to a minimum value, which represents the minimum fault current, the latter being determined from the quotients $(U_{IC} - \sqrt{2} * U_{ac,rms})/R_{fault}$. In contrast to the inverter according to FIG. 1, a DC portion always flows in the inverter according to FIG. 2.

Figure 5:
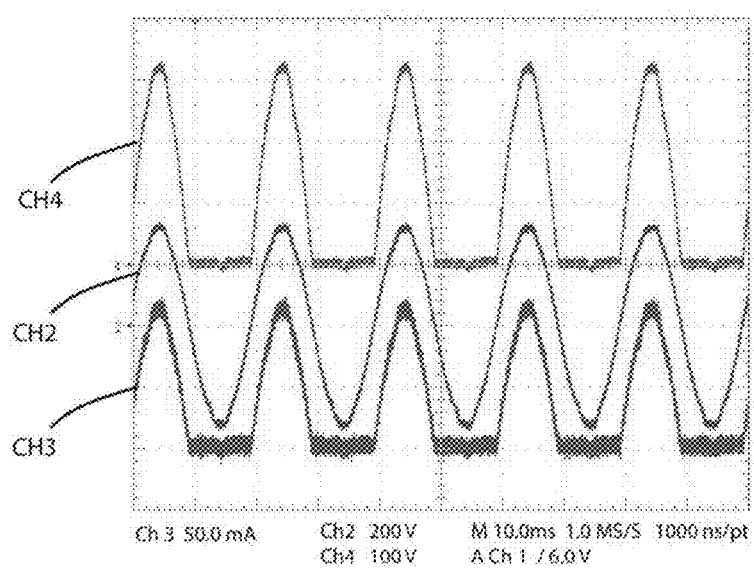
FIG. 5 shows in CH4 the voltage curve between the intermediate circuit voltage and the protective ground potential in an intermediate circuit of a commutation circuit having passive PFC and CH3 shows the fault current, CH2 the input voltage.
Figure 6:
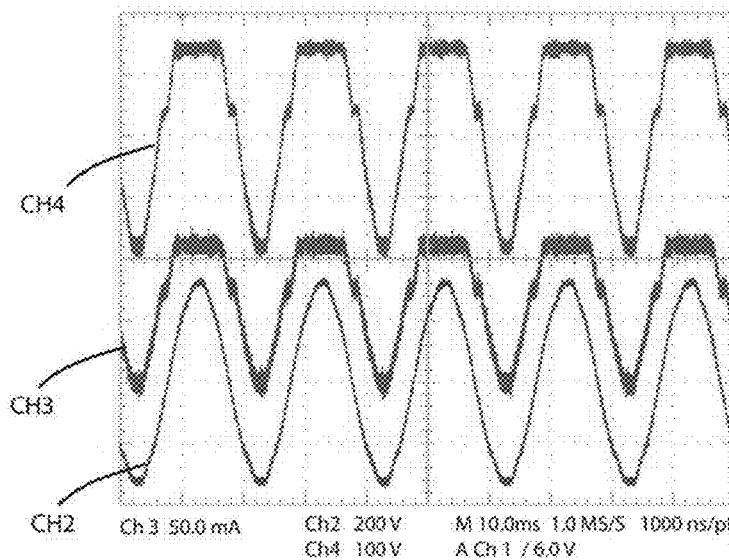
FIG. 6 shows in CH4 the voltage curve between the intermediate circuit voltage and the protective ground potential in an intermediate circuit of a commutation circuit having active PFC and CH3 shows the fault current, CH2 the input voltage.

Depicted in each of the FIGS. 5 and 6 is a situation in which in the case of the two circuit topologies a resistance of $R_{fault}$ of 3 KΩ has been integrated in each case between the intermediate circuit voltage and the protective ground potential (in this case, the conductive housing of the motor).

FIG. 5 represents the measurement results in commutation electronics having passive PFC. In the upper curve (CH4), the voltage drop is plotted over the fault resistance $R_{fault}$. Depicted in the lower curve, (CH3) is the corresponding fault current, which flows via the resistance to the housing.

FIG. 6 shows the measured curves of a corresponding measurement for the case in which commutation electronics having active PFC are used. In these figures, the middle sinusoidal measured curve (channel Ch2) represents the sinusoidal input voltage. The voltage between $U_{IC+}$ and the protective ground potential is reflected by the upper curve (Ch4) and the measured fault current by the resistance $R_{fault}$ is represented by the middle curve form.

Figure 7:
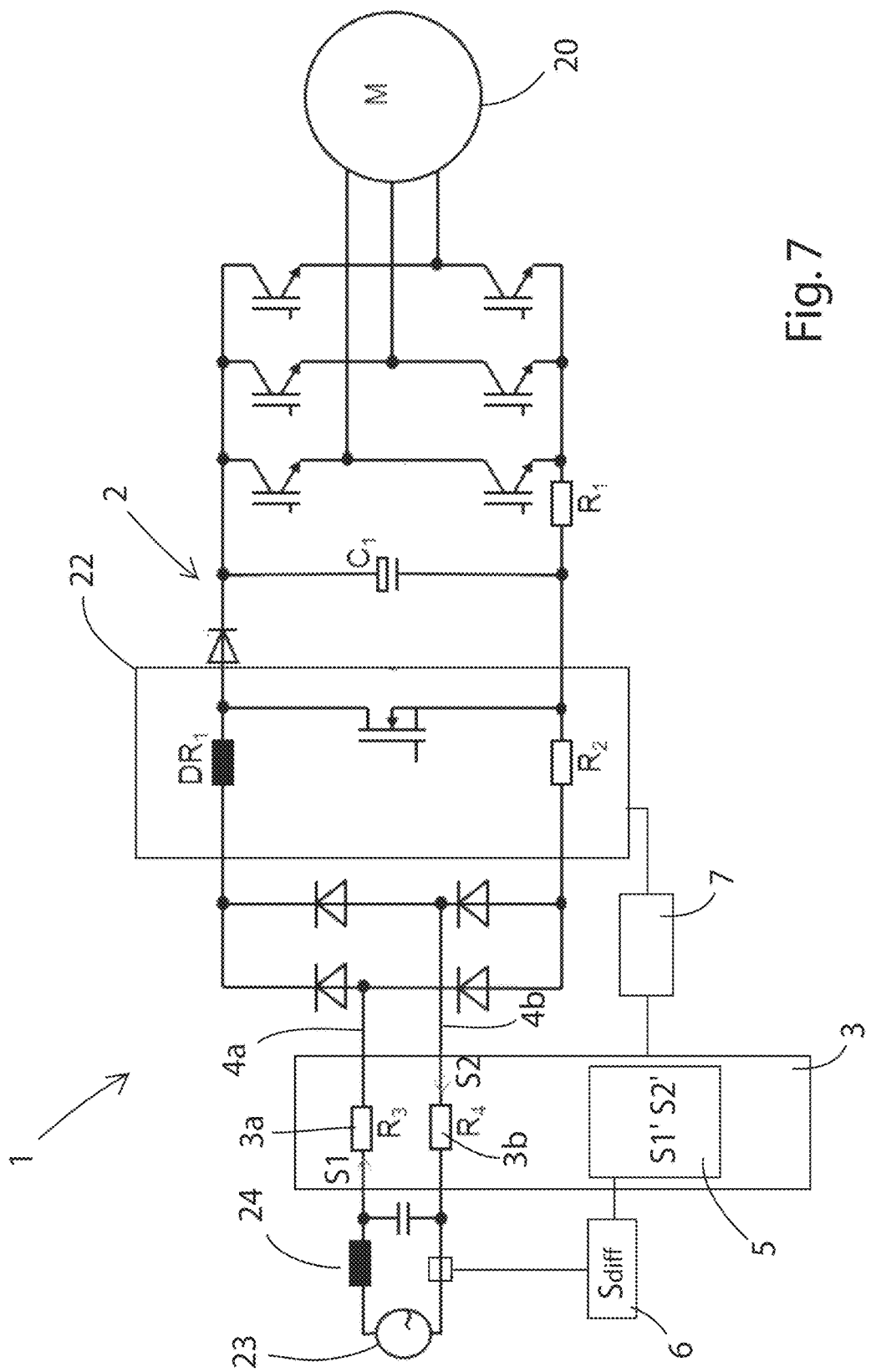
FIG. 7 shows a basic circuit diagram of an exemplary embodiment of the invention of commutation electronics for an EC motor having an active PFC.

FIG. 7 shows the schematic diagram of an exemplary embodiment of the invention of commutation electronics for an EC motor having an active PFC. A device 1 for detecting fault currents in a regulated DC intermediate circuit 2 is shown having an active power factor correction 22 and having a detection device 3 for detecting current signals S1, S2, which flow through the two live conductors 4a, 4b on the input side.

The detection device 3 includes an electrical component 3a, 3b in each of the two live conductors 4a, 4b for tapping current signals $S1 = I_{feed}$ and $S2 = I_{return}$, thus, the currents through the feed line and the return line. With the detection options described below, the detected current value from the feed line and return line is converted into a corresponding analog voltage signal. These voltage signals are preferably fed as input signals to a differential amplifier 6.

A transformer 5 is provided for generating in each case an analog signal S1', S2' from the respectively detected signals S1, S2, as well as a differential amplifier 6 for preparing a signal $S_{DIFF}$ as a difference signal between the signals S1', S2' corresponding to a detected fault current, in particular, in the event that the fault current exceeds maximum permissible threshold value of the signal $S_{DIFF}$.

To lower the intermediate circuit voltage, a circuit configuration 7 is provided, so that a switch-off process is initiated by means of the signal $S_{DIFF}$. The circuit configuration 7 is designed so that the intermediate circuit voltage is lowered by switching off the active power factor correction.

The invention is not limited in its implementation to the aforementioned preferred exemplary embodiments. Rather, a number of variants are conceivable, which use the solution presented, even in the case of embodiments of a fundamentally different type. Thus, the detection device 3, the transformer 4 and/or the circuit configuration 7 may also be designed as a shared circuit.

The invention claimed is:
1. A system comprising:
an EC motor connected to a regulated DC intermediate circuit having a rectifier, an intermediate circuit capacitor, and an inverter having an active power factor correction;
a detection device for detecting a first current signal flowing through a feed conductor and a second current signal flowing through a return conductor, the feed conductor and the return conductor being connected on an input side to an AC voltage source, the detection device including a first electrical component in the feed conductor tapping the first current signal and a second electrical component in the return conductor tapping the second current signal,
a transformer generating a first analog signal proportional to the first current signal and a second analog signal proportional to the second current signal, a differential amplifier generating and amplifying a difference signal corresponding to a difference between the first and second analog signals, and a circuit connected between the active power factor correction and the detection device and configured to lower an intermediate circuit voltage of the regulated DC intermediate circuit by switching off the active power factor correction when the difference signal exceeds a maximum permissible threshold value so that the difference signal can be detected by a type-A fault current circuit breaker.

2. The device according to claim 1, wherein the regulated DC intermediate circuit generates a boosted intermediate circuit voltage.

3. The device according to claim 1, wherein the first and second electrical components are each resistance, inductance, or magnetic field sensors.

4. The device according to claim 1, wherein the differential amplifier comprises a signal preparation module, in order to prepare the difference signal so that it may be further processed by a microcontroller, an ASIC or an integrated circuit.

5. The device according to claim 1, wherein the circuit includes a microcontroller, an ASIC or an integrated circuit for processing the difference signal.

6. A method for detecting fault currents comprising:

detecting, using a detection device, first and second current signals flowing through a feed conductor and a return conductor, respectively, of a regulated DC intermediate circuit connected to an EC motor and having a rectifier, an intermediate circuit capacitor, and an inverter having an active power factor correction, the feed conductor and the return conductor being connected on an input side to an AC voltage source, generating, with a transformer, first and second analog signals proportional to the first and second current signals, respectively, preparing a difference signal between the first and second analog signals, with a differential amplifier, corresponding to a difference between the first and second analog signals, and lowering an intermediate circuit voltage, with a circuit connected between the active power factor correction and the detection device, by switching off the active power correction of the regulated DC intermediate circuit when the difference signal exceeds a maximum permissible threshold value, wherein the difference signal has a wave form that can be detected by a type-A fault current circuit breaker when the difference signal exceeds the maximum permissible threshold value.

7. The method according to claim 6, wherein, by means of the lowering of the intermediate circuit voltage, a voltage curve between the intermediate circuit voltage and a ground potential, generated as a fault current curve, can be detected by the type-A fault current circuit breaker.

8. A system comprising:

an EC motor connected to a regulated DC intermediate circuit having a rectifier, an intermediate circuit capacitor, and an inverter having an active power factor correction;

a detection device having a first electrical component that generates a first current signal identifying current flowing through a feed conductor; and a second electrical component that generates a second current signal identifying current flowing through a return conductor, the feed conductor and the return conductor being connected on an input side to an AC voltage source;

a first transformer that generates a first analog signal proportional to the first current signal;

a second transformer that generates a second analog signal proportional to the second current signal;

a differential amplifier that generates and amplifies a difference signal corresponding to a difference between the first analog signal and the second analog signal; and a circuit connected between the active power factor correction and the detection device and including a microprocessor configured to receive the difference signal and lower an intermediate circuit voltage of the regulated DC intermediate circuit by switching off the active power factor correction when the difference signal exceeds a maximum permissible threshold value so that the difference signal can be detected by a type-A fault current circuit breaker.

* * * * *

UNITED STATES PATENT AND TRADEMARK OFFICE
CERTIFICATE OF CORRECTION

PATENT NO.         : 10,345,347 B2
APPLICATION NO.    : 14/831015
DATED              : July 9, 2019
INVENTOR(S)        : Guenther Haas et al.

It is certified that error appears in the above-identified patent and that said Letters Patent is hereby corrected as shown below:

In the Claims

<u>Column 8</u>
Line 21, Claim 8     "conductor;" should read --conductor--.

Signed and Sealed this
Fifteenth Day of October, 2019

Andrei Iancu
*Director of the United States Patent and Trademark Office*